US008793992B2

(12) United States Patent
Schamp et al.

(10) Patent No.: US 8,793,992 B2
(45) Date of Patent: Aug. 5, 2014

(54) THERMOELECTRIC DEVICE FOR USE WITH STIRLING ENGINE

(75) Inventors: Crispin Thomas Schamp, Austin, TX (US); Lee Tran, Sugarland, TX (US)

(73) Assignee: Spansion LLC, Sunnyvale, CA (US)

( * ) Notice: Subject to any disclaimer, the term of this patent is extended or adjusted under 35 U.S.C. 154(b) by 600 days.

(21) Appl. No.: 12/180,910

(22) Filed: Jul. 28, 2008

(65) Prior Publication Data

US 2010/0018202 A1 Jan. 28, 2010

(51) Int. Cl.

| | |
|---|---|
| ***F01B 29/10*** | (2006.01) |
| ***F02G 1/04*** | (2006.01) |
| ***F01N 3/02*** | (2006.01) |
| ***F01N 5/02*** | (2006.01) |
| ***H01L 35/28*** | (2006.01) |

(52) U.S. Cl.
USPC ............... 60/517; 60/320; 136/204; 136/208; 136/211

(58) Field of Classification Search
USPC ............ 60/516–526, 614–624; 136/200–242; 310/306, 307; 323/282–290
See application file for complete search history.

(56) References Cited

U.S. PATENT DOCUMENTS

| | | | | |
|---|---|---|---|---|
| 3,467,555 A * | 9/1969 | Henderson et al. | 136/205 |
| 3,885,126 A * | 5/1975 | Sugiyama et al. | 392/485 |
| 4,843,273 A * | 6/1989 | Dammers et al. | 310/306 |
| 5,557,934 A * | 9/1996 | Beach | 60/517 |
| 6,041,595 A * | 3/2000 | Halimi et al. | 60/323 |
| 6,053,163 A * | 4/2000 | Bass | 126/312 |
| 6,532,749 B2 | 3/2003 | Rudick et al. | |
| 6,550,255 B2 | 4/2003 | Rudick et al. | |
| 6,675,588 B2 | 1/2004 | Rudick | |
| 6,987,650 B2 * | 1/2006 | Liu et al. | 360/313 |
| 7,100,369 B2 * | 9/2006 | Yamaguchi et al. | 60/324 |
| 7,178,332 B2 * | 2/2007 | Sasaki | 60/320 |
| 7,253,353 B2 * | 8/2007 | Stabler | 136/205 |
| 7,430,875 B2 * | 10/2008 | Sasaki et al. | 62/238.2 |
| 7,658,070 B2 * | 2/2010 | Wootton et al. | 60/614 |
| 2003/0066476 A1 * | 4/2003 | Caillat et al. | 117/3 |
| 2004/0177877 A1 * | 9/2004 | Hightower | 136/211 |
| 2005/0115600 A1 * | 6/2005 | DeSteese et al. | 136/205 |
| 2005/0217714 A1 * | 10/2005 | Nishijima et al. | 136/204 |
| 2007/0017223 A1 * | 1/2007 | Wootton et al. | 60/645 |
| 2007/0193617 A1 * | 8/2007 | Taguchi | 136/204 |

* cited by examiner

*Primary Examiner* — Kenneth Bomberg
*Assistant Examiner* — Christopher Jetton
(74) *Attorney, Agent, or Firm* — Amin, Turocy & Watson, LLP

(57) ABSTRACT

An exhaust gas manifold having thermoelectric devices in the exhaust manifold of a stirling engine is disclosed.

19 Claims, 3 Drawing Sheets

THERMOELECTRIC DEVICE FOR USE WITH STIRLING ENGINE

TECHNICAL FIELD

This invention relates to an exhaust gas manifold which may be used to improve the efficiency of a Stirling engine. The manifold uses thermoelectric devices to convert the thermal energy from the Stirling engine exhaust gases into useable electricity

BACKGROUND

The Stirling engine is a piston engine in which the working gas is not vented after each cycle, but instead permanently contained within the cylinder. The working gas is usually air, helium, or hydrogen. The engine works by exposing the working gas to an external heat source, and then to a cold source which is colder than the external heat source. The gas expands when exposed to the heat source and contracts when exposed to the cold source. The engine has two pistons which extract useable work from the expansion of the gas and also serve to move the gas from the heat source to the cold source. With proper design, the Stirling engine can extract work from the gas both on the heating cycle, and on the cooling cycle. Stirling engines can have efficiencies up to 50% of the Carnot efficiency based upon the temperature difference between the heat source and the cold source.

There are three types of Stirling engines. The alpha Stirling engine uses two power pistons which operate in separate cylinders. The gas in the hot cylinder expands driving a piston which imparts energy to a flywheel. The flywheel turns and the piston in the hot cylinder forces the gas through a pipe where it enters the cold cylinder and is cooled. The gas is allowed to expand in the cool cylinder imparting further power to the flywheel. The piston in the cool cylinder then moves to compress the gas and drive it back through the pipe to the hot cylinder where it is heated, expands and begins the cycle again. The beta Stirling engine has two pistons operating in a single cylinder. The cylinder is divided into a hot region and a cold region. One piston is a power piston which is acted upon by the expanding gas in the hot temperature region and also compresses the gas in the cold region. This piston imparts power to the fly wheel. A displacer piston moves the gas between hot and the cold regions. A gamma Stirling engine is similar to a beta Stirling engine in that it has a power piston and a displacer piston. The two pistons operate off the same flywheel. The gamma Stirling engine has two separate but freely communicating cylinders with the power piston in one cylinder, and the displacer piston in the other cylinder.

The Stirling engine has several advantages over internal combustion engines. The Stirling engine is not limited in the type of fuel it can burn, or even limited to burning of fuel to create heat to operate the engine. Any heat source may be used to provide heat to the hot area of a Stirling engine. The working gas of a Sterling engine is not a hot combustion gas, as in an internal combustion engine. Thus, the Stirling engine is easier to lubricate than an internal combustion engine. The Stirling engine also has higher efficiency than an internal combustion engine. Finally, the Stirling engine runs quietly. In spite of these advantages, the Stirling engine is used only in specialized applications such as aboard submarines.

The Stirling engine has some major disadvantages which prevent its wide spread use. The Stirling engine is larger than an internal combustion engine for the same output. In addition, the cost of a Stirling engine per kilowatt is higher than that of the less efficient internal combustion engine. Accordingly, except for specialized applications, the Stirling engine is not widely used. There is a need to increase the efficiency of the Stirling engine in order to achieve the advantages that it offers.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

The subject invention provides an exhaust gas manifold that may be used with a Stirling engine to improve the efficiency of the engine. This improved efficiency is obtained through the use of thermoelectric devices to capture heat which would otherwise be lost.

One aspect of the invention relates to an exhaust manifold usable with a Stirling engine comprising one or more thermoelectric devices positioned with the hot side of the thermoelectric device in contact with the exhaust from the Stirling engine and the cold side of the thermoelectric device outside the manifold.

Another aspect of the invention relates to an exhaust manifold comprising one or more thermoelectric devices positioned with the hot side of the thermoelectric device in contact with the exhaust from a Stirling engine and the cold side of the thermoelectric device outside the manifold in which the manifold is covered with an insulating layer.

Yet another aspect of the invention relates to an exhaust manifold comprising one or more thermoelectric devices positioned with the hot side of the thermoelectric device in contact with the exhaust from a Stirling engine and the cold side of the thermoelectric device outside the manifold in which the thermoelectric device is a bismuth telluride thermoelectric device.

Still yet another aspect of the invention relates to a method of improving efficiency of a Striling engine involving postioning a thermoelectric device on an exhaust gas manifold, the thermoelectric device positioned so that a hot side of the thermoelectric device contacts exhaust gas and a cold side of the thermoelectric device contacts air outside the exhaust gas manifold.

To the accomplishment of the foregoing and related ends, the invention comprises the features hereinafter fully described and particularly pointed out in the claims. The following description sets forth in detail certain illustrative aspects and implementations of the invention. These are indicative, however, of but a few of the various ways in which the principles of the invention may be employed. Other objects, advantages and novel features of the invention will become apparent from the following detailed description of the invention.

DETAILED DESCRIPTION

Figure 1:
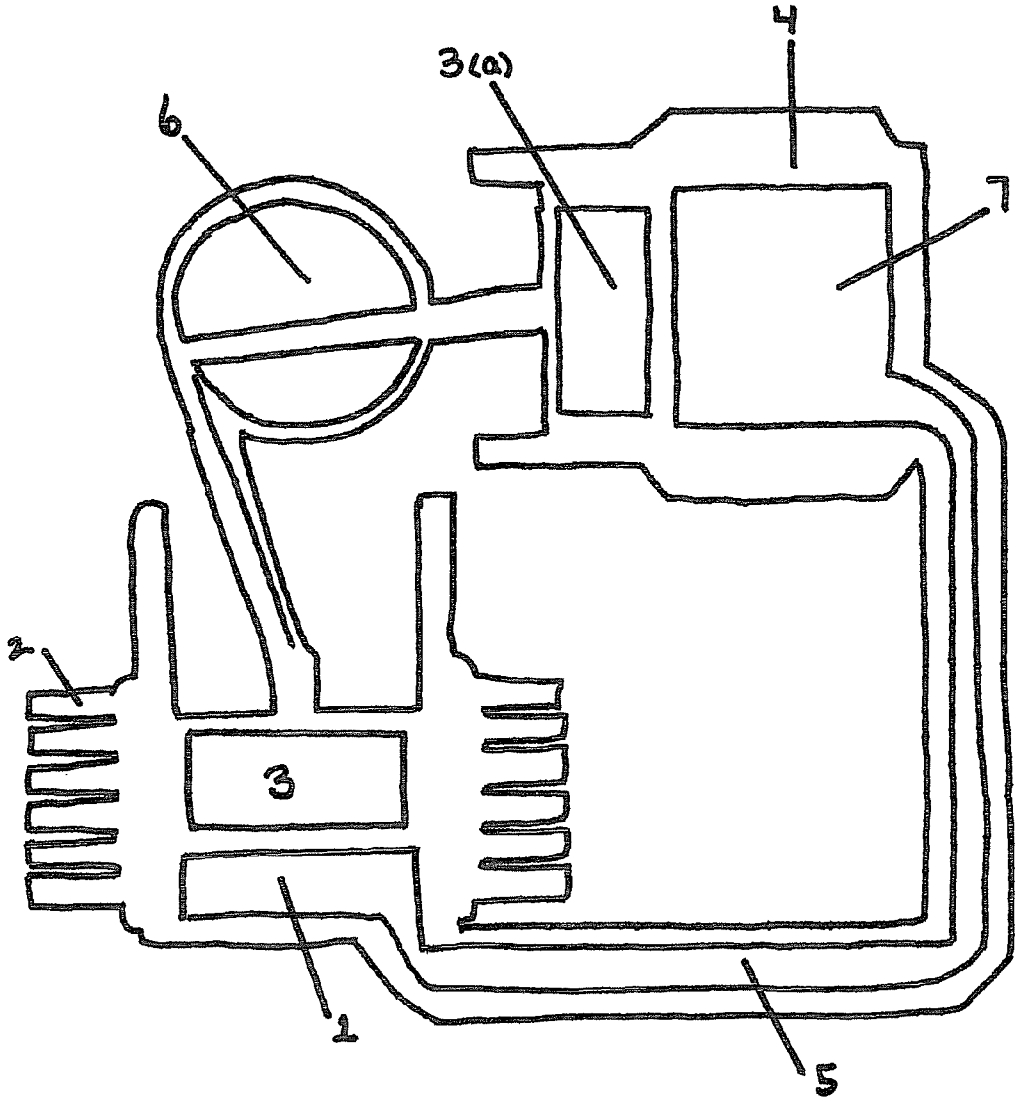
FIG. 1 is a cross section of a two cylinder Stirling engine in accordance with one aspect of the subject invention.

Stirling engines containing one or more thermoelectric devices operate with improved efficiency. A thermoelectric device converts a temperature difference into electric power. One end of the thermoelectric device is exposed to a heat source, while the other end of the device is colder. Heat which is conducted through the thermoelectric device is converted into electric current. The conversion of a thermal differential to a current flow is called the Seebeck effect. Mobile charge carriers in the thermoelectric device diffuse from the hot side of the thermoelectric device to the cold side. Depending upon the type of charge carriers in the material the cold side of the thermoelectric device may be either positive or negative. If the charge carriers are electrons, the cold side of the device will have a negative charge. If the charge carriers are holes, the cold side of the thermoelectric device will have a positive charge.

The migration of the charge carriers continues and builds up a charge separation until the electric field becomes large enough to cause the carriers to migrate away from the cold side at a rate equal to the rate of diffusion to the cold side. If the temperature differential between the hot and cold side of the thermoelectric device is increased, further migration of charge carriers can take place and the potential difference increases. The thermopower of a material is defined as the voltage difference produced per ° K of temperature difference between the sides of the material. Thermopower is actually not a measure of the electrical power which the thermoelectric device will produce, but rather a measure of the voltage difference which the device will produce. Metals generally have low thermopower values because in a metal, both electrons and holes can migrate. Both the holes and the electrons diffuse to the cold side of the metal, and neutralize each other. Thus a metal produces only a relatively small voltage differential for a given temperature difference. Semiconductors, which have been doped to create an excess of one type charge carrier, generally have relatively high thermopower values. Good thermoelectric materials have thermopower values of approximately one hundred μV/° K.

Commonly, both p-type and n-type are used in a single thermoelectric device. A block of n-type semiconductor and a block of a p-type semiconductor are placed in contact with the heat source. The opposite side of the n-type and p-type semiconductor are placed in contact with the low temperature side of the thermoelectric device. Electrons flow toward the cold side of the n-type semiconductor. Positive holes flow toward the cold side of the p-type thermoelectric device. A positive charge builds up on the cool end of the p-type semiconductor, and a negative charge builds on the cool end of the n-type semiconductor. Separate electrodes are placed on the cool side of the n-type and p-type semiconductors. When the two electrodes are connected through an electrical load, an electric current flows, and thermal energy is converted into electrical energy.

A common type of thermoelectric device contains alternating n-type and p-type semiconductor elements connected together by metallic electrode at the hot end and connected to separate electrodes at the cold end. The n-type and p-type semiconductors are connected in series so that a higher voltage is obtained than that available from an individual pairs of semiconductors. In the n-type element, electrons flow from the hot end of the device toward the cool end. In the p-type element, holes flow from the hot end of the device toward the cool end. The circuit is completed through an external circuit and thermal energy is converted into electrical energy. Doped bismuth telluride is often used as both the p-type and n-type semiconductor elements. The n-type bismuth telluride may be doped with selenium. The p-type bismuth telluride may be doped with antimony. Other semiconductor materials such as doped single crystal silicon, lead telluride, silicon boron alloys, silicon germanium alloys, iron disilicide, silicon carbide, bismuth telluride, copper selenide, alloys of periodic table family IV elements lead, tin, and germanium, periodic table family V elements bismuth and antimony, and periodic table family VI elements tellurium and selenium. Quantum dots can also be employed as thermoelectric materials.

FIG. 1 is a cross section of a two cylinder Stirling engine. The Stirling engine has two cylinders, that is, the cold cylinder 1 and hot cylinder 7. Inside cylinder 1 there is a piston 3 which serves to move the gas between the hot cylinder 7 and the cold cylinder 1 through gas pipe 5. The cold cylinder is cooled by the cold source acting upon the cooling fins 2. The hot cylinder is heated by the hot source 4. Piston 3(*a*) is acted upon by the hot gas in the hot cylinder 7 during the power stroke. The momentum of the flywheel 6 moves the pistons 3 and 3(*a*) which forces the gas from the hot cylinder 7 through gas pipe 5 into the cold cylinder. The gas contracts and gives up heat to the cold source. The gas is then driven from the cold cylinder 1 to the hot cylinder 7 where it expands providing a new power stroke.

Figure 2:
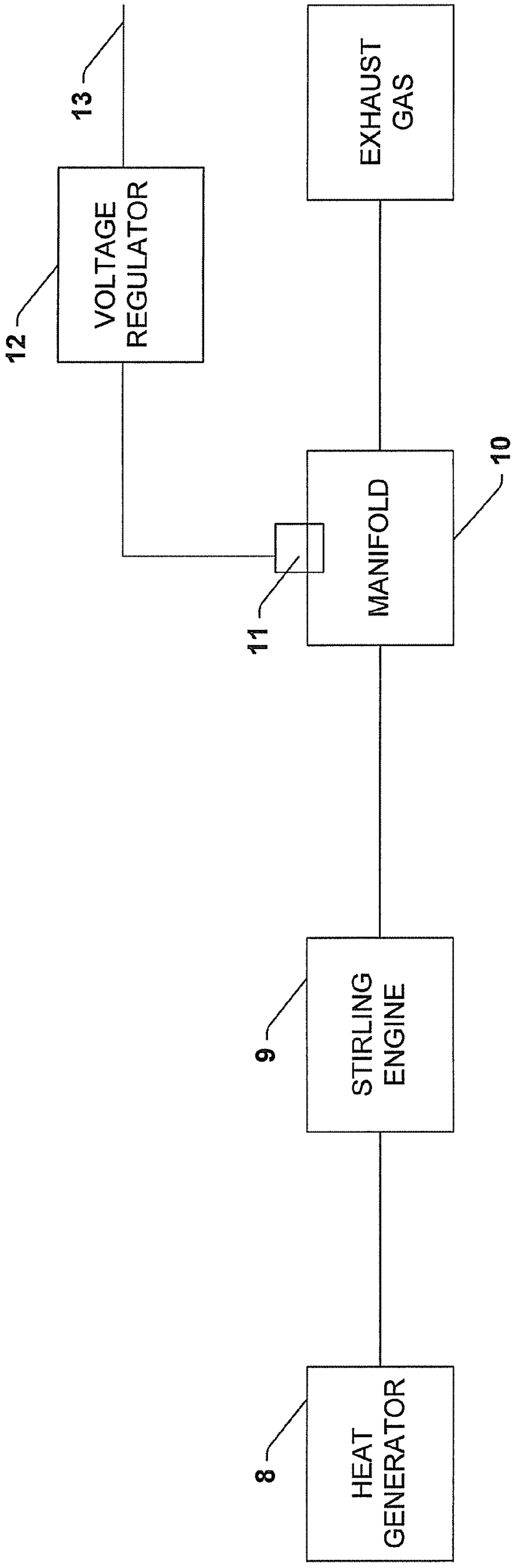
FIG. 2 is a block diagram of a heat generator, a Stirling engine, and a manifold in accordance with one aspect of the subject invention.

FIG. 2 is a block diagram of a heat generator, a Stirling engine, and a manifold according to the present invention. Heat is generated by the heat generator 8, and is conducted to the Stirling engine 9. From the Stirling engine the exhaust gas is conducted to a manifold 10 with thermoelectric devices 11 in the wall. The heat of the exhaust gas passes through the thermoelectric devices and the exhaust gas cools as it passes through the manifold. The cooled exhaust gas is discharged from the manifold. The voltage generated by the thermoelectric device 11 is conducted to a voltage regulator 12 to supply output voltage to connector 13.

Figure 3:
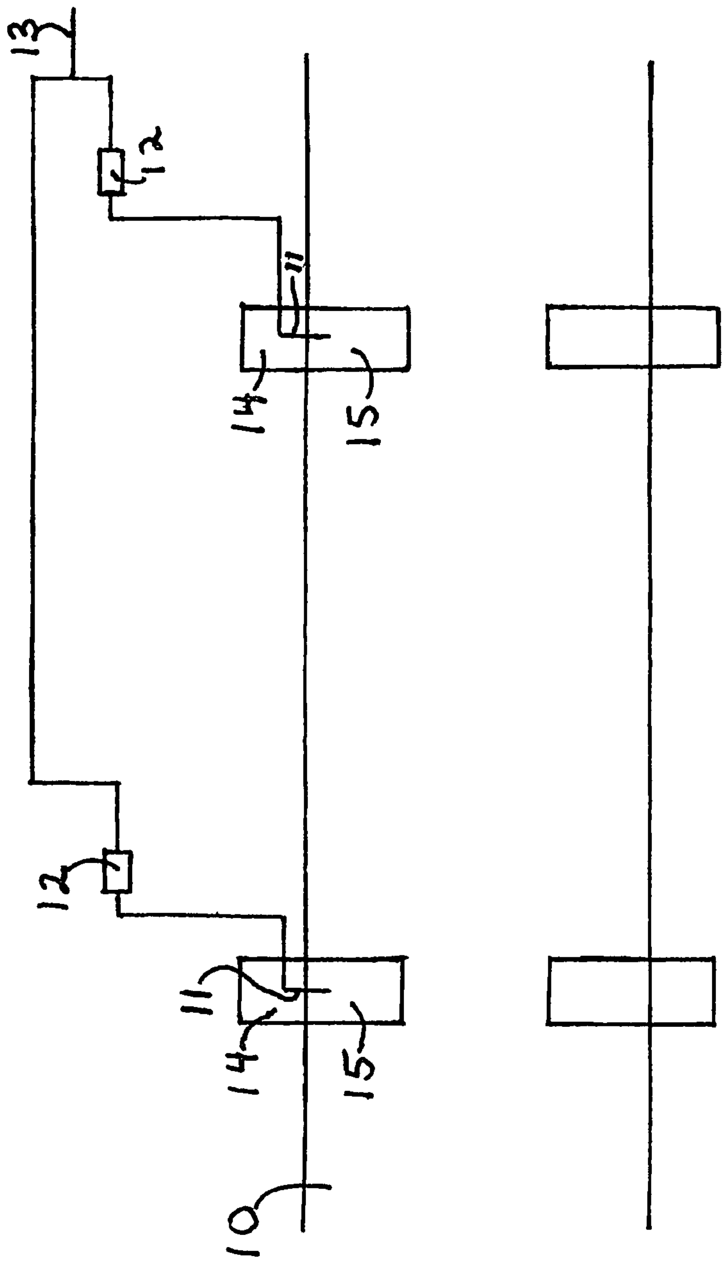
FIG. 3 is a cross section of a manifold according to one aspect of the subject invention.

FIG. 3 is a cross section of a manifold according to the present invention. The manifold 10 is connected to the output of the Stirling engine. Heat exchanger fins 15 extend into the manifold and contact both the exhaust gas, and the hot side of the thermoelectric device 11. Cooling fins 14 contact the cold side of the thermoelectric device 11. Voltage from the thermoelectric devices 11 is conducted to voltage regulators 12. Although the temperature of the exhaust gas drops as the gas moves down the manifold the voltage regulators 12 are adjusted to have the same voltage output at connector 13.

In the conversion of heat to mechanical work some energy is converted to useful work, and some of the heat energy is given up to a cold temperature source. Accordingly, a device which converts heat to mechanical energy requires both a heat source and a cold temperature source. In the Stirling engine, the working gas is warmed by the heat source and expands. The gas is then moved to the cold source, where it contracts. This expansion and contraction of the working gas acts against piston in the Stirling engine which allows the Stirling engine to perform useful work. When the gas is transferred from the contact with the heat source to contact with the cold source, the gas is cooled and contracts. Energy is given up given up to the cold source.

The hot area of the Stirling engine is generally in the form of a right circular cylinder with a piston inside. This cylinder may be heated by almost any heat source. For example, waste heat from an internal combustion engine can be used to drive a Stirling engine. Heat may be generated by burning ordinary fuels such as gasoline, kerosene or diesel fuel. One great advantage of the Stirling engine is that, as opposed to internal combustion engines which have demanding requirements for fuel, a Stirling engine can use almost any source of fuel. This allows the Stirling engine to employ fuel sources which would otherwise go to waste. For example, a Stirling engine could use waste materials such as lumber scraps, wood chips, waste paper, straw, wheat chaff, rice hulls, or corn stalks. Whatever form of energy is used to heat the hot source, it is desirable for the Stirling engine to capture as much of the heat as possible. If combustion is used as a heat source, a certain amount of heat will be wasted in the removal of the combustion gases as the exhaust of the Stirling engine. Although various means, known to those skilled in the art, may be employed to extract as much heat as possible from the combustion gas, no matter what measures are taken, a certain amount of heat is lost with the escaping combustion gas.

If the exhaust of the Stirling engine is simply released to the environment, the work potential of the warm exhaust is lost. The efficiency of converting heat to work may be enhanced by conducting the exhaust gas through a manifold which has one or more thermoelectric devices placed therein. Any thermoelectric device which generates electric power from a thermal differential may be used in the present invention. Thermoelectric devices using bismuth telluride semiconductor elements are widely available. Other thermoelectric devices such as quantum dot devices offer greater efficiency, but may not be as readily available as bismuth telluride devices. Thermoelectric devices which have several P and N type semiconductor elements connected to each other in series have important advantages. Such devices generate usable DC voltages, for example 12 to 16 volts, depending on the temperature difference between the hot and cold side of the thermoelectric device.

The manifold functions to convey the hot exhaust gases away from the Stirling engine. The manifold can be of any shape as long as the shape does not restriction the flow of the exhaust gases. Manifolds of square, rectangular, or circular cross section are most convenient. The manifold may be designed so that the exhaust gas flows naturally. Such flow requires that the exhaust gases which exit the manifold are sufficiently warm that the manifold will function as a chimney and provide proper draw for the exhaust gases. Proper draw will be provided only if the exhaust gases are somewhat warmer than the ambient air. Inevitably, a certain amount of energy will be lost as the warm exhaust gas exits from the manifold. Alternatively, the manifold may provide more restrictive gas flow with greater exposure of the exhaust gas to the thermoelectric devices. This restrictive exhaust gas flow will extract more heat from the exhaust gas, but will impair the natural flow of the exhaust gas through the manifold. Flow of the exhaust gas may be assisted by a fan which draws the exhaust gas through the manifold. The fan may be operated by electricity provided by the thermoelectric devices. However, the use of such a fan does use some of the energy provided by the thermoelectric devices. Thus, providing extra exposure of the thermoelectric devices to the exhaust gases can increase electric output, but the resulting restriction of air flow may require the expenditure of energy to provide an exhaust gas fan. Although it may be desirable, in some cases, to determine the optimal degree of restriction, in most cases, the manifold containing thermoelectric devices will produce useable electric power and enhance the efficiency of the Stirling engine without such optimization.

The thermoelectric devices are placed in the wall of the manifold with the hot side in contact with the exhaust of the Stirling engine, and the cold side outside the manifold. Heat will be transferred from the hot exhaust gases and the exhaust gas will eventually be cooled. In order to assure heat transfer from the exhaust gases to the thermoelectric devices heat exchangers may be placed in the manifold to assure that the heat from the exhaust gas is made available to the thermoelectric device and is conducted through the device. A finned heat exchanger is preferred. The fins are placed so that they line up with the direction of the flow of the exhaust gas. The thickness of the fins in the finned heat exchanger can vary. Thinner fins may be placed closer together and provide more efficient heat exchange at the cost of greater resistance to air flow. Thicker fins placed further apart, cause less resistance to air flow, but provide less efficient heat exchange. This loss of efficiency can be overcome by increasing the number of thermoelectric devices within the manifold.

The cold side of the thermoelectric device could simply be exposed to the ambient air. Efficiency of cooling the cold side of the thermoelectric device may be enhanced by the use of a finned heat exchanger on the cool side of the thermoelectric device. If the Stirling engine is located near a source of cold water the thermoelectric device could be water cooled. However, for such cooling to be practical, and not require more energy than that which can be gained by water cooling the thermoelectric device, the water to cool the thermoelectric device must flow freely without requiring energy to move it. Such water might come from a river or stream. Alternatively, water which is required for some other process might be diverted to cool the thermoelectric devices. The use of cooling water requires plumbing to bring the water to and from the thermoelectric devices, and maintenance to assure that there are no water leaks. In most cases water cooling of the thermoelectric devices will not be practical, and the thermoelectric devices will be cooled by ambient air.

In order to provide improved performance, it is preferred that the manifold be covered by a layer of insulation. The layer of insulation prevents warm air from the engine exhaust from warming the cold side of the thermoelectric device, and thus maintains the temperature differential necessary for the thermoelectric device to generate electric power. The insulating layer should not cover the cold end of the thermoelectric device.

The insulation may be of a type well known to those skilled in the art. The temperature of the exhaust gases will determine the type of insulation to be used. Since the Stirling engine may use a wide variety of fuels, the exhaust temperature could vary depending on the fuel used. It is therefore preferred to select an insulation which will accommodate the highest temperature exhaust that will likely be produced by the engine. For example, the insulation may be fiber glass, plastic foam insulation, and ceramic insulation such as firebrick and the like. Fiber glass insulation is inexpensive and easy to apply. However, fiberglass insulation is easily damaged and must be covered by some sort of protective materials in order to remain intact during use. Plastic foam insulation is easy to apply and is not as easily destroyed as fiber glass. However, plastic foam has severe temperature limitations, and may not be able to tolerate the exhaust manifold temperatures in some applications. Ceramic block insulation can be used at temperatures up to 1200° C., and is extremely sturdy. However, ceramic block insulation is difficult to place around a manifold and difficult to cut to allow the thermoelectric devices to protrude through the insulation. There are powder compositions which may be mixed with water and applied to the manifold where the composition sets like concrete. The upper temperature limit of this ceramic material is about 1100° C., and it is not as durable as ceramic blocks.

The voltage developed by a thermoelectric device depends on the temperature difference between the hot side and the cold side of the device. As the exhaust gas travels along the manifold, heat is conducted through the thermoelectric devices, and thus the gas is cooled as it passes through the manifold. Accordingly, thermoelectric devices closer to the Stirling engine develop a higher voltage than those farther along the manifold. It is convenient to place the thermoelectric devices in groups in the manifold. The groups are arranged so that all the thermoelectric devices in the group are exposed to exhaust gas of the same temperature. The thermoelectric devices of the same type at the same temperature differential generate the same voltage. By providing several groups of thermoelectric devices in the manifold it is possible to obtain several different voltages from the thermoelectric devices in the exhaust manifold. For example, the thermoelectric devices could be arranged in circular bands around a cylindrical exhaust manifold having a circular cross section. The highest voltage would be produced by the band of thermoelectric devices closest to the Stirling engine while the lowest voltage would be produced by the thermoelectric devices closest to the end of the exhaust manifold.

Different types or compositions of thermoelectric devices can be arranged in different locations along an exhaust manifold (typically a cylindrical exhaust manifold having a substantially circular cross section). The thermoelectric device compositions which are optimized for relatively high temperature operations would be located closest to the Stirling engine, and those optimized for relatively lower temperature operations would be located closest to the end of the exhaust manifold. Selection of a specific type/composition of thermoelectric devices can be made in view of the temperature ranges and requirements of specific Stirling engine operating temperature range.

Other factors can lead to variations in the output voltage of the thermoelectric devices. Stirling engines which are powered by a well controlled fuel such as natural gas and which run steadily can achieve a relatively constant exhaust gas temperature. On the other hand, Stirling engines which are heated by the combustion of waste materials such as lumber scraps, wood chips, waste paper, straw, wheat chaff, rice hulls, or corn stalks, have rather variable exhaust gas temperatures depending upon the type of fuel being burned, and the exact conditions of combustion. In addition, if ambient air is used to cool the cold side of the thermoelectric devices, there can be quite a bit of variability in the temperature of the cold side of the thermoelectric device. The voltage output of the thermo electric devices may be quite variable.

The problems of variable output voltage along the manifold, and variable output voltage due to variation in exhaust temperature may both be solved through the use of voltage regulators to provide a steady voltage. There are many types of direct current voltage regulators. For example, there are several types of electromechanical voltage regulators which could be used. However, solid state voltage regulators are generally used today. Passive regulators such as zener diodes, pass a given voltage for which they are designed, and shunt the rest of the voltage to ground. This is a wasteful scheme for producing power. However, such a diode may be used to produce a reference voltage which is useful as a standard for other types of voltage regulators.

There are two main types of solid state active voltage regulators. Linear regulators operate as voltage dividers. The output voltage is controlled by a variable element. The change in the variable element allows the regulator to provide a constant output from a variable input voltage. The output voltage is lower than the input voltage. An example of such a device is the simple transistor regulator. In this regulator the transistor is part of a voltage divider which controls the output voltage. A feedback circuit compares a reference voltage to the output voltage. The difference between these voltages is used to adjust the input to the transistor, thereby keeping the output voltage fairly constant. This is an inefficient method of voltage regulation. There is a voltage loss across the transistor, and the power loss in the transistor is the current flowing through the transistor times the voltage loss across the transistor. This power loss is converted to heat.

Switching regulators have a solid state switch in series with the voltage to be regulated. The power to the load is rapidly switched on and off in response to the voltage output of the circuit. If the voltage falls, the switch provides more pulses of power to the load. The regulator circuit includes an energy storage device such as an inductor. Switching regulators can provide an output voltage higher than the input voltage. If this technique is applied to the voltages produced by the thermoelectric devices in the exhaust manifold, the voltage produced by thermoelectric devices closer to the Stirling engine would either not be increased by regulation, or would receive only a small increase. The voltage produced by the cooler thermoelectric devices farther away from the Stirling engine in the exhaust manifold can be regulated to increase their voltage output. The output from the thermoelectric devices can be connected to voltage regulators which are adjusted to a common output voltage. By this means, the thermoelectric devices of the exhaust manifold can produce a single voltage.

Similarly, in cases where the exhaust temperature fluctuates because of variable combustion conditions, voltage regulators can be provided to produce a constant voltage output from variable voltage inputs. In this situation, the voltage regulators are compensating for variations caused by the position of the thermoelectric device in the exhaust manifold, and for variations caused by variation in the temperature of the exhaust gas. The exhaust manifold would produce a single output voltage.

The following examples illustrate the subject invention. Unless otherwise indicated in the following examples and elsewhere in the specification and claims, all parts and percentages are by weight, all temperatures are in degrees Centigrade, and pressure is at or near atmospheric pressure.

With respect to any figure or numerical range for a given characteristic, a figure or a parameter from one range may be combined with another figure or a parameter from a different range for the same characteristic to generate a numerical range.

Example 1

A Stirling Engine Having a Fire for the Heat Source and an Exhaust Gas Manifold Containing Thermoelectric Devices A fire is contained in a steel cylindrical container approximately 60 centimeters in diameter and 75 centimeters long. The grate on which the fire is built has a fine grid work at the bottom which allows the passage of air, but retains the combustible material. Air vents below the grate admit air to the combustion chamber. The fuel used to provide heat is placed in the combustion chamber and ignited. The hot combustion gases are conducted to the heat source of the Stirling engine. After providing energy for the Stirling engine, the exhaust gases are conducted to a manifold having thermoelectric devices in the wall of the manifold. The manifold is located above the fire box. It has a square cross section 10 cm on a side and is one meter long. The manifold is insulated with ceramic insulation. Three thermoelectric devices are placed in each side of the manifold each one of which is in contact with a finned heat exchanger placed inside the manifold in contact with the exhaust gas. Finned heat exchangers provide cooling for the cold end of the thermoelectric device.

Example 2

A Stirling Engine Having a Natural Gas Burner for the Heat Source and an Exhaust Gas Manifold Containing Thermoelectric Devices A natural gas burner is contained in a steel cylindrical container approximately 60 centimeters in diameter and 75 centimeters long. The natural gas is fed to a burner in which the proper volume of air is mixed with the natural gas in order to provide an efficient flame. The hot combustion gases are conducted to the heat source of the Stirling engine. After providing energy for the Stirling engine, the exhaust gases are conducted to a manifold having thermoelectric devices in the wall of the manifold. The manifold is located above the fire box. It has a square cross section 10 cm on a side and is one meter long. The manifold is insulated with ceramic insulation. Three thermoelectric devices are placed in each side of the manifold each one of which is in contact with a finned heat exchanger placed inside the manifold in contact with the exhaust gas. Finned heat exchangers provide cooling for the cold end of the thermoelectric device.

Example 3

A Stirling Engine Having a Natural Gas Burner for the Heat Source and a Cylindrical Exhaust Gas Manifold Containing Thermoelectric Devices A natural gas burner is contained in a steel cylindrical container approximately 60 centimeters in diameter and 75 centimeters long. The natural gas is fed to a burner in which the proper volume of air is mixed with the natural gas in order to provide an efficient flame. The hot combustion gases are conducted to the heat source of the Stirling engine. After providing energy for the Stirling engine, the exhaust gases are conducted to a cylindrical manifold having thermoelectric devices in the wall of the manifold placed in five bands around the circumference of the manifold. Each thermoelectric device one is in contact with a finned heat exchanger placed inside the manifold in contact with the exhaust gas. Finned heat exchangers provide cooling for the cold end of the thermoelectric device. The manifold located above the fire box is insulated with ceramic insulation.

Example 4

A Stirling Engine Having the Exhaust of a Diesel Generator for the Heat Source and an Exhaust Gas Manifold Containing Thermoelectric Devices The exhaust of a diesel generator is conducted to the heat source of the Stirling engine. After providing energy for the Stirling engine, the exhaust gases are conducted to a manifold having thermoelectric devices in the wall of the manifold. It has a square cross section 10 cm on a side and is one meter long. The manifold is insulated with ceramic insulation. Three thermoelectric devices are placed in each side of the manifold each one of which is in contact with a finned heat exchanger placed inside the manifold in contact with the exhaust gas. Finned heat exchangers provide cooling for the cold end of the thermoelectric device.

Example 5

A Stirling Engine Having a Landfill Gas Burner for the Heat Source and an Exhaust Gas Manifold Containing Thermoelectric Devices A landfill gas burner is contained in a steel cylindrical container approximately 60 centimeters in diameter and 75 centimeters long. The landfill gas is fed to a burner in which the proper volume of air is mixed with the landfill natural gas in order to provide an efficient flame. The hot combustion gases are conducted to the heat source of the Stirling engine. After providing energy for the Stirling engine, the exhaust gases are conducted to a manifold having thermoelectric devices in the wall of the manifold. The manifold is located above the fire box. It has a square cross section 10 cm on a side and is one meter long. The manifold is insulated with ceramic insulation. Three thermoelectric devices are placed in each side of the manifold each one of which is in contact with a finned heat exchanger placed inside the manifold in contact with the exhaust gas. Finned heat exchangers provide cooling for the cold end of the thermoelectric device.

Example 6

A Stirling Engine Having a Natural Gas Burner for the Heat Source and an Exhaust Gas Manifold Containing Thermoelectric Devices and Voltage Regulators A natural gas burner is contained in a steel cylindrical container approximately 60 centimeters in diameter and 75 centimeters long. The natural gas is fed to a burner in which the proper volume of air is mixed with the natural gas in order to provide an efficient flame. The hot combustion gases are conducted to the heat source of the Stirling engine. After providing energy for the Stirling engine, the exhaust gases are conducted to a manifold having thermoelectric devices in the wall of the manifold. The manifold is located above the fire box. It has a square cross section 10 cm on a side and is one meter long. The manifold is insulated with ceramic insulation. Three thermoelectric devices are placed in each side of the manifold each one of which is in contact with a finned heat exchanger placed inside the manifold in contact with the exhaust gas. Finned heat exchangers provide cooling for the cold end of the thermoelectric device. The thermoelectric devices are located in bands so that the thermoelectric devices in the first band are all the same distance from the Stirling engine. Similarly, the second and third bands of thermoelectric devices are at their respective distance from the Stirling engine. The thermoelectric devices in each band of thermoelectric devices have a separated switching voltage regulator. The switching voltage regulators are adjusted so that the voltage output of each band of thermoelectric devises is the same. Thus, the thermoelectric devices of the exhaust manifold produce a single voltage.

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A Stirling engine exhaust gas manifold comprising:

a first thermoelectric device positioned so that a hot side of the first thermoelectric device contacts exhaust gas conveyed in the exhaust gas manifold and a cold side of the first thermoelectric device contacts air outside the exhaust gas manifold;

a second thermoelectric device positioned so that a hot side of the second thermoelectric device contacts exhaust gas conveyed in the exhaust gas manifold, wherein the second thermoelectric device is so positioned to be operating under a disparate temperature range from the first thermoelectric device, and a cold side of the first thermoelectric device contacts air outside the exhaust gas manifold;

a first voltage regulator electrically coupled to the first thermoelectric device and a second voltage regulator electrically coupled to the second thermoelectric device, each of the first and second voltage regulators comprising a solid state switch and an inductor electrically coupled to the solid state switch, wherein each solid state switch regulates a voltage received from the coupled thermoelectric device to provide a single common voltage, and wherein each inductor provides energy to the solid state switch coupled thereto in response to changes in current of a regulated single common voltage.

2. The exhaust gas manifold according to claim 1, wherein the first thermoelectric device comprises a bismuth telluride semiconductor comprising a series of n-type layers doped with selenium and p-type layers doped with antimony.

3. The exhaust gas manifold according to claim 2, wherein the second thermoelectric device comprises a bismuth telluride semiconductor comprising a series of n-type layers doped with selenium and p-type layers doped with antimony.

4. The exhaust gas manifold according to claim 3, wherein the first thermoelectric device comprises a series of n-type layers and p-type layers in accordance with the temperature range to be experienced by the first thermoelectric device and the second thermoelectric device comprises a bismuth telluride semiconductor comprises a series of n-type layers and p-type layers in accordance with the temperature range to be experienced by the first thermoelectric device.

5. The exhaust gas manifold according to claim 1, wherein the first voltage regulator regulates the first voltage to mitigate the effect of at least one of position of the first thermoelectric device in relation to the position of the second thermoelectric device, a composition of the first thermoelectric device in relation to a composition of the second thermoelectric device, or fluctuation in exhaust gas temperature.

6. The exhaust gas manifold according to claim 1, further comprising a second voltage regulator associated with the second thermoelectric device.

7. The exhaust gas manifold according to claim 6, wherein the second voltage regulator regulates a second voltage received from the second thermoelectric device in accordance with a single output voltage common to the first thermoelectric device and a second thermoelectric device positioned on the manifold.

8. The exhaust gas manifold according to claim 7, wherein regulation of the second voltage is performed to mitigate any effects resulting from fluctuation in exhaust gas temperature.

9. The exhaust gas manifold according to claim 1, further comprising an insulating layer covering the exhaust gas manifold such that the cold side of the first thermoelectric device is exposed to the air outside the exhaust gas manifold.

10. The exhaust gas manifold according to claim 9, wherein the insulating layer comprises at least one of fiber glass or ceramic.

11. A Stirling engine comprising:

a first thermoelectric device coupled to an exhaust gas manifold, the first thermoelectric device positioned so that a hot side of the first thermoelectric device contacts exhaust gas conveyed in the exhaust gas manifold and a cold side of the first thermoelectric device contacts air outside the exhaust gas manifold;

a first voltage switching regulator associated with the first thermoelectric device, further comprising a first solid state switch in series with the voltage to be regulated; and a first inductor electrically coupled to the solid state switch for receiving current therefrom;

a second thermoelectric device coupled to the exhaust gas manifold, the second thermoelectric device positioned so that a hot side of the second thermoelectric device contacts exhaust gas conveyed in the exhaust gas manifold and a cold side of the second thermoelectric device contacts air outside the exhaust gas manifold; wherein the second thermoelectric device is positioned relative to the first thermoelectric device in accordance with the relative compositions of the first thermoelectric device and the second thermoelectric device;

a second voltage switching regulator associated with the second thermoelectric device, further comprising:

a second solid state switch in series with the voltage to be regulated; and a second inductor electrically coupled to the second solid state switch for receiving current therefrom;

an insulating layer covering the exhaust gas manifold such that the cold side of the first thermoelectric device and the cold side of the second thermoelectric device are exposed to the air outside the exhaust gas manifold; and wherein the first inductor and the second inductor provide voltage to the first voltage switching regulator and the second voltage switching regulator, respectively, in response to changes in current thereby providing a regulated common voltage.

12. The Stirling engine according to claim 11, wherein the insulating layer comprises at least one of fiber glass or ceramic.

13. The Stirling engine according to claim 11, wherein voltage regulation of the first thermoelectric device and voltage regulation of the second thermoelectric device is performed such that voltage output of the first thermoelectric device and voltage output of the second thermoelectric device are in accordance with a common voltage output.

14. The Stirling engine according to claim 11, wherein the first thermoelectric device comprises a bismuth telluride semiconductor comprising a series of n-type layers doped with selenium and p-type layers doped with antimony and the second thermoelectric device comprises a bismuth telluride semiconductor comprising a series of n-type layers doped with selenium and p-type layers doped with antimony.

15. The Stirling engine according to claim 14, wherein the respective series of n-type and p-type layers, and degree of selenium doping in the n-type layer and antimony doping in p-type layer, in the first thermoelectric device and second thermoelectric device is a function of an operating temperature range to be experienced by the first thermoelectric device and the operating temperature range to be experienced second thermoelectric device.

16. A method of improving efficiency of a Stirling engine, comprising:

positioning a first thermoelectric device on an exhaust gas manifold, the first thermoelectric device positioned so that a hot side of the first thermoelectric device contacts exhaust gas and a cold side of the first thermoelectric device contacts air outside the exhaust gas manifold;

positioning a second thermoelectric device on the exhaust gas manifold, the second thermoelectric device positioned so that a hot side of the second thermoelectric device contacts exhaust gas and a cold side of the second thermoelectric device contacts air outside the exhaust gas manifold, positioning of the second thermoelectric device is based upon the compositions of the first thermoelectric device and the second thermoelectric device;

covering the exhaust gas manifold with an insulating layer such that the exterior surface of the exhaust gas manifold is covered with the insulating layer while leaving the cold side of the first thermoelectric device and the cold side of the second thermoelectric device exposed to the air outside the exhaust gas manifold;

regulating, with a first solid state switch and a first inductor, the voltage output of the first thermoelectric device;

regulating, with a second solid state switch and a second inductor, the voltage output of the second thermoelectric device such that the voltage output of the first thermoelectric device and the voltage output of the second thermoelectric device are in accordance with a common output voltage defined for any thermoelectric device generating voltage from the exhaust gas; and receiving into the inductor associated with at least one of the first solid state switch or the second solid state switch, energy in the form of an electric current associated with the first voltage or the second voltage, wherein the energy received is available for subsequent processing by at least one of the first solid state switch or the second solid state switch when at least one of the voltage output of the first device or the voltage output of the second device is below the common output voltage.

17. The method according to claim 16, wherein the first thermoelectric device comprises a bismuth telluride semiconductor comprising a series of n-type layers doped with selenium and p-type layers doped with antimony and the second thermoelectric device comprises a bismuth telluride semiconductor comprising a series of n-type layers doped with selenium and p-type layers doped with antimony, the respective series of n-type and p-type layers, and degree of selenium doping in the n-type layer and antimony doping in p-type layer, in the first thermoelectric device and second thermoelectric device is a function of an operating temperature range to be experienced by the first thermoelectric device and the operating temperature range to be experienced second thermoelectric device.

18. The method of claim 16, wherein the compositions of the first thermoelectric device and the second thermoelectric device are substantially equal, positioning the second thermoelectric device on the exhaust gas manifold at a position having a substantially equal temperature to a temperature of the exhaust gas manifold at the position of the first thermoelectric device.

19. The method of claim 16, wherein the compositions of the first thermoelectric device and the second thermoelectric device are dissimilar, positioning the second thermoelectric device on the exhaust gas manifold at a position having a temperature different to the temperature of the exhaust gas manifold at the position of the first thermoelectric device.

* * * * *